United States Patent [19]
Brotz

[11] Patent Number: 4,534,997
[45] Date of Patent: Aug. 13, 1985

[54] HIGH-TEMPERATURE CARBON FIBER COIL AND METHOD FOR PRODUCING SAME

[76] Inventor: Gregory R. Brotz, P.O. Box 1322, Sheboygan, Wis. 53081

[21] Appl. No.: 591,323

[22] Filed: Mar. 19, 1984

[51] Int. Cl.[3] ....................... H01L 39/12; H01L 39/24
[52] U.S. Cl. ..................................... 427/53.1; 427/57; 427/113; 427/116; 427/120; 427/189; 427/190; 427/375; 427/376.2; 427/377; 427/380; 29/599; 29/605; 242/7.03
[58] Field of Search ................. 29/599, 605; 242/7.07, 242/7.03; 427/57, 53.1, 113, 116, 120, 189, 190, 195, 375, 376.2, 377, 380

[56] References Cited

U.S. PATENT DOCUMENTS

| | | | |
|---|---|---|---|
| 3,594,226 | 7/1971 | Thomas | 427/62 |
| 3,951,870 | 4/1976 | Economy et al. | 29/599 |
| 4,188,413 | 2/1980 | Lupinski et al. | 427/32 |
| 4,299,861 | 11/1981 | Dietrich et al. | 427/62 |
| 4,329,377 | 5/1982 | Voelker et al. | 427/32 |
| 4,407,062 | 10/1983 | Sutcliffe et al. | 29/599 |

OTHER PUBLICATIONS

Smith et al., Applied Polymer Symposium, No. 29, John Wiley and Sons, Inc., 1976, pp. 83-92.

*Primary Examiner*—Richard Bueker
*Attorney, Agent, or Firm*—William Nitkin

[57] ABSTRACT

A coil comprising a carbon filament winding with fused particulate insulative coating therearound and method of producing such carbon filament coil.

9 Claims, 5 Drawing Figures

HIGH-TEMPERATURE CARBON FIBER COIL AND METHOD FOR PRODUCING SAME

BACKGROUND OF THE INVENTION

1. Field of the Invention

This invention relates to insulated conductive wires and more particularly relates to the use of carbon or graphite filaments or rovings as windings for coils and the like.

2. History of the Prior Art

Carbon or graphite filaments in wires have been utilized in the prior art as, for example, automobile ignition wires where low resistance and high conductivity are desired. Problems, though, often occur due to the fragile nature of continuous carbon filaments and their insulation. It has been suggested in the prior art in Atwood et al, U.S. Pat. No. 534,596 of Feb. 19, 1895 that carbon as an electrical conductor will possess many qualities not found in metallic electrical conductors, but as this prior art patent indicated, no one as far as the inventors were aware had devised a carbon conductor which was flexible and was surrounded with an insulating coating so it could be useful where the other well-known forms of insulated metallic conductors could be utilized such as in coils were carbon fibers still are not considered suitable for use. The Atwood invention proposes a method of insulating carbon filaments by braiding a cotton thread to surround the carbon wire. It further suggests that an electromagnet could be constructed of such insulated carbon filaments.

SUMMARY OF THE INENTION

It is an object of this invention to provide an improved carbon or graphite filament or roving conductor surrounded with an insulative coating so that the resulting product can be utilized more successfully than that of the prior art for a variety of applications including the production of coils where such carbon or graphite filaments have heretofore not been felt to be available for use even though the advantages from the use of this material would be greater than that of metallic wiring. It should be obvious that a coil produced from carbon which has a coating thereon for insulation so that the windings are electrically insulated from one another, if available to operate at high temperatures, could have many uses due to the properties of the carbon filaments. Such uses can include, but are certainly not limited to, hot magnetic swagging operations, magneto-hydrodynamic production of electric energy, fusion reactors, accelerators, induction heating and motors that operate inside furnaces.

One method of this invention for fabricating such a coated carbon wire to produce a coil suitable for operation at a high temperature, for example, is to provide a carbon filament or roving which can be drawn from a spool and passed through a dip bath of micro-divided ceramic mixed with sufficient water to form a slip. From the slip bath the filament is wound around a ceramic core to produce a coil winding. This coil winding would then be fired. If the core were not desired in the final product, it could be made of a material that would decompose upon firing the ceramic material. During the firing of the coil, the temperature profile or ramp would start with a drying stage to eliminate the excess moisture which if trapped therein might cause a rupturing at the higher firing temperatures. The preferred refractory material would be one with an extremely high melting point and good electric resistivity. Metal oxides should be avoided because in the presence of carbon they will, during the heating process, cause reduction and thereby destroy the refractory while at the same time cause oxidation of the carbon and thereby destroy the winding. This destruction, though, depends on the temperature at which the device is operated and the strength of the metal oxygen bond. Borides, carbides, nitrides or silicates are groups from which a coating can be chosen. Carbides are felt to be one of the most desirable of these groups with silicon carbide being preferred having a very high melting point and high electrical resistivity measured in ohms per centimeter.

A method of producing a continuous carbon coil inside a silicon carbide matrix would be to mix together finely divided silicon and carbon in the proper stoichiometric amount and vibrate the mixture ultrasonically into a loosely wound coil of carbon filaments. This structure could then be pressed into a cavity to exclude all air and compact the structure and bring the reactants closer together. Then this unit would be fired at which time the silicon and carbon would react to form a silicon carbide as the insulating matrix for the carbon filament coil.

Another method to produce a large diameter carbon filament coil using a similar compression method as described above can be to use pure silicon. Upon firing, the silicon would react with the surface of the carbon filament to produce a silicon carbide. The amount of silicon that would be used would have to be determined so that it would all react leaving no pure silicon which would be an undesirable conductor. The carbon core of the filament would be undisturbed.

A still further method of producing an insulated carbon filament would be to draw the filament first through a container of adhesive binder solution and then through a second container of powdered silicon where the adhesive would pick up a coating of the powdered silicon. The filament would then pass through an oven to bake the adhesive silicon coating so as to devolatilize the adhesive and to ensure the silicon coating was well-adhered to the filament. The now-coated filament would then be directed into a vacuum firing chamber where it would be wound onto a coil under a high temperature electron plasma, one electrode pole being the carbon filament by contact with its core and the other pole being a second electrode placed above the winding coil inside the chamber. In some embodiments it may be desirable to have the firing chamber filled or exchanged with an inert gas. The plasma would form at the top of the coil near the second electrode with extreme heat in the range of 5,000 degrees Celsius, which heat will cause a reaction of the adhesive binder, silicon and the surface of the carbon filament to form a continuous silicon carbide matrix around the carbon windings of the coil. Hafnium or tantalum can also be utilized instead of silicon. The adhesive binder should be one that carbonizes and contributes to the formation of the carbide. This method can also be accomplished by laser-induced fusion whereby, instead of the plasma being formed by electrodes, a laser beam directed inside the inert atmosphere of the firing chamber at the filament's first contact with the coil could supply the heat for the reaction.

The above mentioned methods could also be utilized when the continuous filament is a carbon precursor or uncarbonized filament in cases where the carbonization of the filament would occur simultaneously with the winding of the coil and the insulation formation stage.

Further structures to make such carbon coils can be made where the insulator is in a molten state with the carbon winding and molten insulator sealed in a vitrous chamber. Upon the start-up of the carbon coil with an unmolten insulator, the carbon would have a higher resistance value because of the low initial temperature so that the carbon coil itself will act as a heater to melt the insulator. As the molten insulator's temperature rises, the resistance value of the carbon filament decreases and there would be an equilibrium reached wherein the resistance value of the carbon would be so low that the temperature of the insulator could not be increased at a set current level. The temperature of the molten insulator will not increase with an increase in current level for further increases in current level after the temperature equilibrium has been reached will be manifested in electromagnetic radiations which may be modulated.

DESCRIPTION OF THE PREFERRED EMBODIMENT(S)

Figure 1:
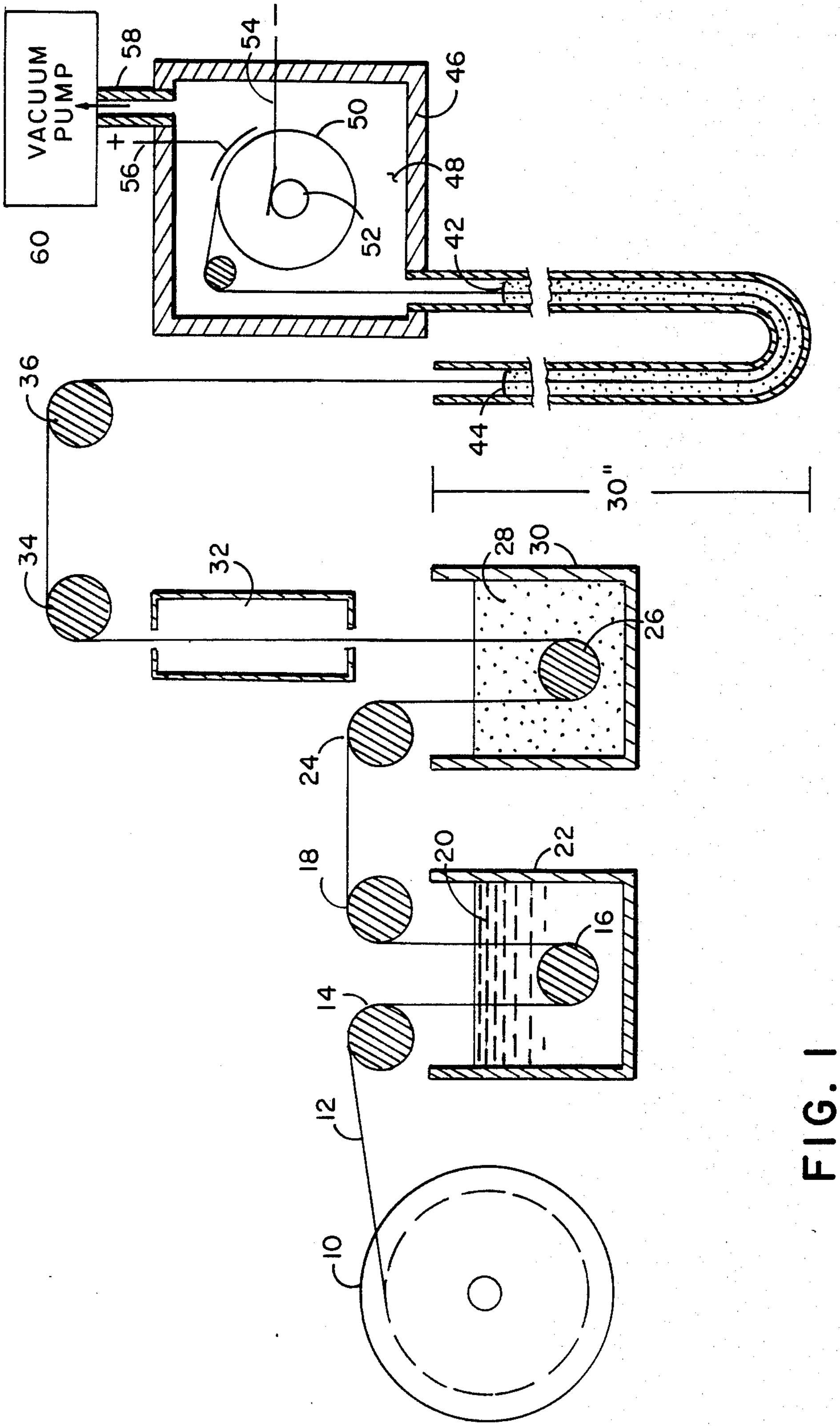
FIG. 1 illustrates a continuous filament drawn successively through an adhesive binder, silicon, baking oven and into a firing chamber for high temperature insulation melting and winding.

FIG. 1 illustrates a method of production of carbon coils wherein first carbon filament 12 from spool 10 is first passed over rollers 14 and 16 into container 22 through an adhesive bath 20 and then drawn over rollers 18 and 24 and passed into container 30 through powdered silicon 28 and then passed through oven 32 where the silicon is baked onto the filament which is then passed over rollers 34 and 36 and through an atmosphere trap 38, being a U-shaped tube of mercury 40 seeking its own level at points 42 and 44. Coated filament 12 is then entered into firing chamber 48 which can be a vacuum chamber or contain an inert gas where it is wound upon coil 50 having central spool 52 thereof as one pole of first electrode 54 and second electrode 56 entered into the chamber's container 46 with both electrodes, when operating, forming an electric plasma to fuse the coating. These electrodes as a heating source can be replaced by heat produced by a laser to provide a high temperature at the point where the coated filament is wound upon the spool.

Figure 2:
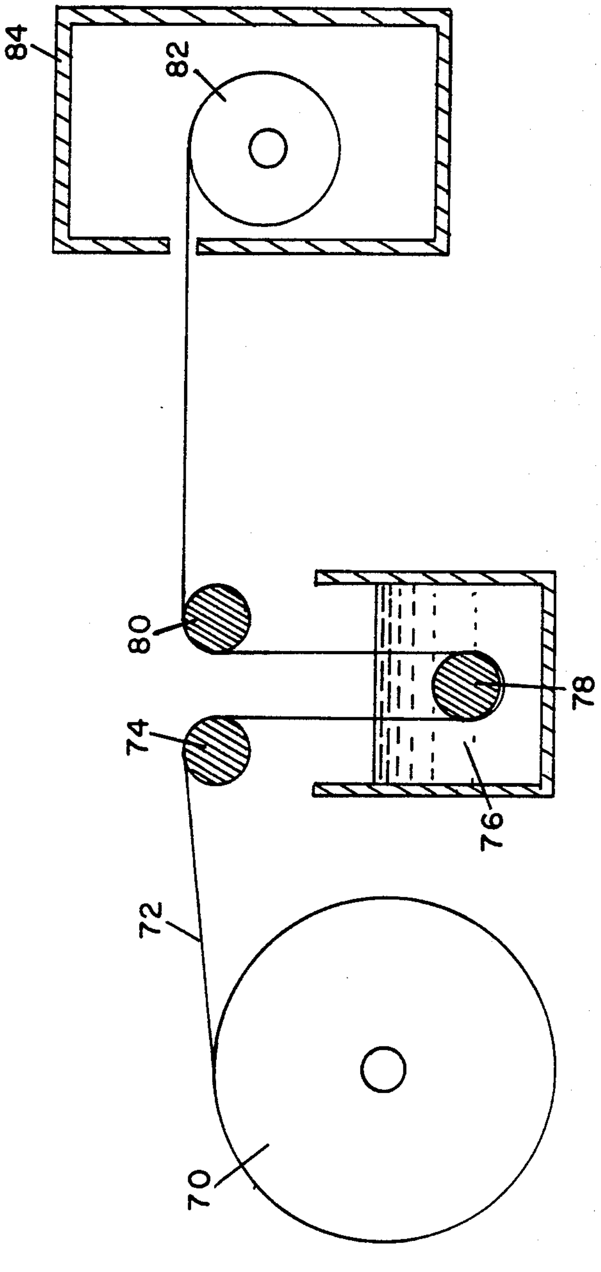
FIG. 2 illustrates a continuous filament drawn through a dip bath and formed into a coil which is fired in an oven.

FIG. 2 illustrates a carbon or graphite filament 72 being drawn from spool 70 over rollers 74 and 78 through a dip bath of micro-divided ceramic and water forming a slip 76 and over roller 80 and wound around a ceramic core 82 to produce a coil winding. This coil is shown within oven 84 where it is fired to melt the ceramic around the carbon to form insulation of one winding form the other.

Figure 3:
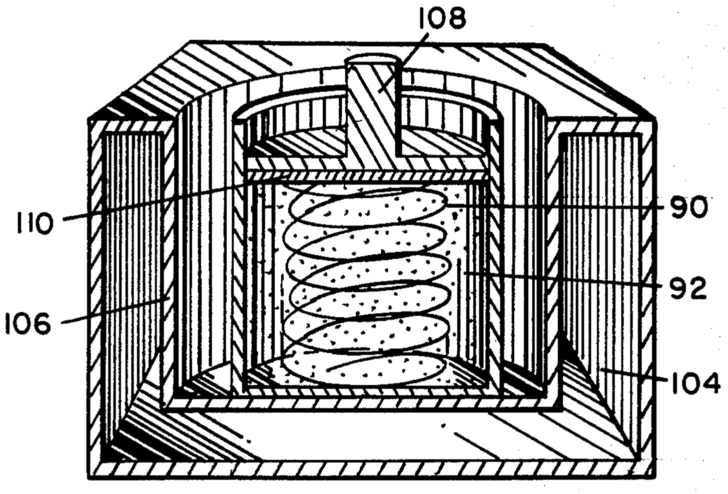
FIG. 3 illustrates the compression of a coil mixed with finely divided coating material before baking.
Figure 3A:
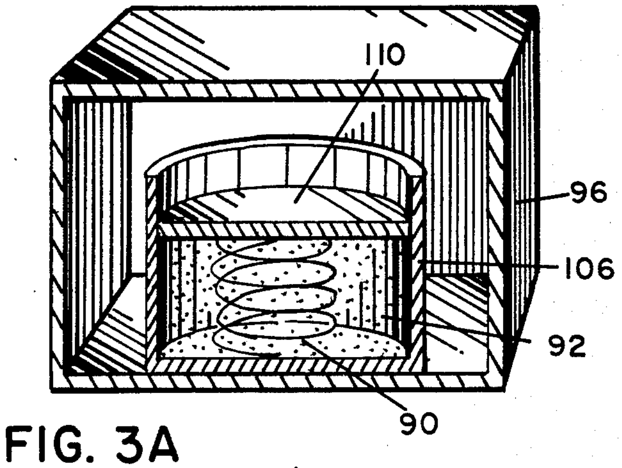
FIG. 3*a* illustrates the baking of the coil of FIG. 3.

FIG. 3 illustrates the embodiment wherein a coil of carbon filament 90 is mixed with a finely divided insulative coating formation material 92 which can be from the group of materials discussed above such as a silicon-carbon mixture or pure silicon which is mixed in with coil 90. Ultrasonic vibrators 104 can help mix the coating formation material thoroughly and the container 106 is packed tight by packing means such as piston 108 and made air-tight. Container 106 can be capped such as by cap 110 to exclude air as seen in FIG. 3*a* and then fired in an oven 96 or by equivalent means.

Figure 4:
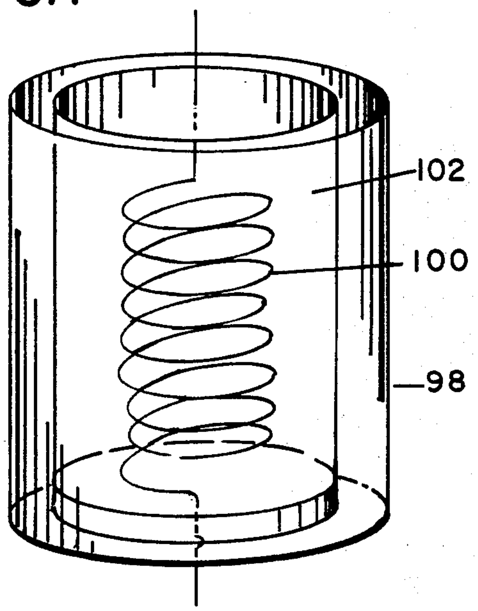
FIG. 4 illustrates a molten insulator coil.

FIG. 4 illustrates a molten cell in a vitreous chamber 98 having coil 100 surrounded by an insulating material 102 that becomes molten on operation of the coil as discussed above.

Although the present invention has been described with reference to particular embodiments, it will be apparent to those skilled in the art that variations and modifications can be substituted therefor without departing from the principles and spirit of the invention.

I claim:

1. A method of providing an insulative coating on a carbon filament to be wound in a coil, comprising the steps of:

providing a spool of carbon filament;

drawing a filament from said spool;

passing said filament through an adhesive binder bath;

coating said filament with said adhesive binder;

passing said filament through a powdered insulator;

adhering said powdered insulator to said carbon filament by said adhesive binder;

passing said insulator-coated filament then through oven means;

baking said insulator onto said carbon filament;

passing said insulator-coated filament into a firing chamber;

winding said insulator-coated filament into a coil;

heating said insulator-coated filament at a high temperature as it is wound; and fusing said insulator coating onto said filament to provide insulation of said coil windings from one to another.

2. The method of claim 1 further including, before the step of heating said insulator-coated filament at high temperature, the step of:

providing a first electrode attached to the core of the coil;

providing a second electrode disposed above said coil as it is being wound; and forming an electron plasma within said firing chamber between said first and second electrodes to fuse said insulator coating onto said filament.

3. The method of claim 1 further including, before the step of heating said coated filament at a high temperature within said firing chamber, the step of:

laser-induced fusing of said insulator coating by a laser with its beam aimed upon said coated carbon filament at the point where it is wound onto the coil.

4. The method of claim 1 further including, before the step of passing said coated filament into a firing chamber, the step of:

passing said insulator-coated filament through an atmosphere trap before it enters into said firing chamber.

5. The method of claims 1, 2, 3 and 4 wherein said carbon filament is a carbon precursor or uncarbonized filament that is carbonized by heat during the winding of the coil.

6. A method of producing a carbon filament coil comprising the steps of:

combining a carbon filament coil with a particulate insulator;

holding said coil and particulate insulator in a predetermined area;

excluding oxygen from said coil and particulate insulator; and firing said structure to melt and fuse said insulator around said coils of filament.

7. The method of claim 6 further including, after the step of combining said carbon filament with said particulate insulator, the steps of compressing it in a container and vibrating ultrasonically the container to cause said particulate insulator to surround all of said filament's coils.

8. The method of claim 6 wherein said particulate insulator is pure silicon.

9. The method of claim 6 wherein said particulate insulator is a mixture of powdered carbon and silicon.

* * * * *